US005783335A

United States Patent [19]
Laia, Jr. et al.

[11] Patent Number: 5,783,335
[45] Date of Patent: Jul. 21, 1998

[54] FLUIDIZED BED DEPOSITION OF DIAMOND

[75] Inventors: Joseph R. Laia, Jr.; David W. Carroll; Mitchell Trkula; Wallace E. Anderson, all of Los Alamos; Steven M. Valone, Santa Fe, all of N. Mex.

[73] Assignee: The Regents of the University of California, Office of Technology Transfer, Alameda, Calif.

[21] Appl. No.: 864,725

[22] Filed: Apr. 7, 1992

[51] Int. Cl.$^6$ ............................................. B01J 8/24
[52] U.S. Cl. .................. 427/459; 423/446; 427/247; 427/590
[58] Field of Search .............. 423/446; 156/DIG. 68; 427/249, 459, 590, 577; 204/157.43, 157.44, 157.47

[56] References Cited

U.S. PATENT DOCUMENTS

| | | | |
|---|---|---|---|
| 4,063,907 | 12/1977 | Lee et al. | 51/295 |
| 4,228,142 | 10/1980 | Holcombe, Jr. et al. | 423/446 |
| 4,265,982 | 5/1981 | McCreary et al. | 428/608 |
| 4,434,188 | 2/1984 | Kamo et al. | 427/39 |
| 4,647,512 | 3/1987 | Venkataramanan et al. | 428/688 |
| 4,664,944 | 5/1987 | Hsu et al. | 427/87 |
| 4,770,907 | 9/1988 | Kimura | 427/217 |
| 4,816,291 | 3/1989 | Desphandey et al. | 427/38 |
| 4,822,466 | 4/1989 | Rabalais et al. | 204/192.15 |
| 4,859,493 | 8/1989 | Lemelson | 427/45.1 |
| 4,866,005 | 9/1989 | Davis et al. | 437/100 |
| 4,943,488 | 7/1990 | Sung et al. | 428/552 |
| 5,015,528 | 5/1991 | Pinneo | 428/403 |

FOREIGN PATENT DOCUMENTS

| | | | |
|---|---|---|---|
| 286310 | 10/1988 | European Pat. Off. | 423/446 |
| 135117 | 8/1983 | Japan | 423/446 |
| 137311 | 8/1984 | Japan | 423/446 |

OTHER PUBLICATIONS

J. Am. Chem. Soc. vol. 73(5), pp. 1150–1152 (1990), Okubo et al., "Plasma Nitriding of Titanium Particles in a Fluidized Bed Reactor at a Reduced Pressure."

Adv. Mater. vol. 3, No. 1 pp. 64–66 (1991), Backman et al., Diamond and Diamond–Like Carbon.

Science, vol. 241, pp. 913–921, 19 Aug. 1988, Angus et al., "Low–Pressure, Metastable Growth of Diamond and Diamondlike: Phases".

General Electric Corporate Research and Development Report 86CRD247, Mar. 1987, Devries, "Synthesis of Diamond Under Metastable Conditions".

*Primary Examiner*—Michael Lewis
*Assistant Examiner*—Stuart Hendrickson
*Attorney, Agent, or Firm*—Bruce H. Cottrell

[57] ABSTRACT

A process for coating a substrate with diamond or diamond-like material including maintaining a substrate within a bed of particles capable of being fluidized, the particles having substantially uniform dimensions and the substrate characterized as having different dimensions than the bed particles, fluidizing the bed of particles, and depositing a coating of diamond or diamond-like material upon the substrate by chemical vapor deposition of a carbon-containing precursor gas mixture, the precursor gas mixture introduced into the fluidized bed under conditions resulting in excitation mechanisms sufficient to form the diamond coating.

6 Claims, No Drawings

FLUIDIZED BED DEPOSITION OF DIAMOND

FIELD OF THE INVENTION

The present invention is directed to a rapid, efficient, and economical process for coating a substrate with diamond by chemical vapor deposition within a fluidized bed.

BACKGROUND OF THE INVENTION

Diamond is an allotrope of carbon which is metastable at ordinary pressures, having a large activation energy barrier which prevents conversion to graphite, the more stable allotrope at ordinary temperatures and pressures. In addition to its value as a precious gem, diamond finds uses in many industrial applications such as, e.g., tool coatings for polishing, grinding, sawing and drilling operations, windows in high pressure cells, microtome knives for biological and medicinal uses, radiation detectors, temperature measurements, heat sinks, wire drawing dyes, styli for phonographs, and hardness indenters. Numerous approaches have been attempted to synthesize diamond.

One approach has been to use high pressure methods since at high pressures diamond is the thermodynamically stable form of carbon rather than graphite. Unfortunately, high pressure methods have limited applications since only small diamond crystals have been made and such small crystals are generally suitable only for use as abrasives and in forming sintered preforms used as wire drawing dyes or tool bits. Further, the product of such high pressure diamond synthesis is often contaminated with impurities of generally uncontrollable concentration and distribution, rendering such diamond unsuitable in many applications.

U.S. Pat. No. 4,859,493 by Lemelson describes methods of forming synthetic diamond coatings on particles using microwave energy. In one embodiment, Lemelson describes fluidizing the particles to be coated with diamond by streams of a fluid formed of gas molecules. Lemelson further describes diamond coating objects such as bearings, bearing components, electrical components, and other objects which suffer surface attrition.

U.S. Pat. No. 5,015,528 by Pinneo describes a process of forming synthetic diamond by vapor deposition of a carbon gas source in the presence of atomic hydrogen on a substrate contained in a fluidized bed, the substrate or particles to be coated forming the particles of the fluidized bed.

It is an object of the present invention to provide a process for coating a substrate with diamond in a fluidized bed.

It is another object of the present invention to provide a process for coating a substrate with diamond via chemical vapor deposition in a fluidized bed utilizing a carbon source gas and atomic hydrogen to improve deposition of diamond.

It is yet another object of the invention to provide a process of coating optical substrates with diamond and the resultant diamond-coated optical substrates wherein such diamond is deposited in a fluidized bed process.

SUMMARY OF THE INVENTION

To achieve the foregoing and other objects, and in accordance with the purposes of the present invention, as embodied and broadly described herein, the present invention provides a process for coating a substrate with diamond including maintaining a substrate within a bed of particles capable of being fluidized, the particles having substantially uniform dimensions and the substrate characterized as having different dimensions than the particles, fluidizing the bed of particles, and depositing a coating of diamond upon the substrate by chemical vapor deposition of a carbon-containing precursor gas mixture, the precursor gas mixture introduced into the fluidized bed of particles in quantities, at pressures, and at temperatures, under conditions resulting in excitation mechanisms sufficient to form the diamond coating. In another embodiment, the substrate is further characterized as comprised of a different material than the bed particles.

In still another embodiment, the present invention provides a process for coating a substrate with diamond including maintaining a substrate within a bed of particles capable of being fluidized, the particles having substantially uniform dimensions and the substrate characterized as comprised of a different material than the particles, fluidizing the bed of particles, and depositing a coating of diamond upon the substrate by chemical vapor deposition of a carbon-containing precursor gas mixture, the precursor gas mixture introduced into the fluidized bed of particles in quantities, at pressures, and at temperatures, under conditions resulting in excitation mechanisms sufficient to form the diamond coating.

In yet another embodiment of the invention, an optical substrate is maintained within a fluidized bed of particles and appropriate feed vapors are contacted with the bed under chemical vapor deposition conditions to deposit diamond onto the optical substrate.

By the processes according to the present invention, diamond-coated substrates having advantageous properties and applications are obtainable. Particular advantages of the present invention may include the ability to produce reduced grain size diamond films, such grain sizes being substantially uniform in size, the ability to produce pin-hole free diamond coatings, and the ability to work-harden the resultant diamond films during formation. Further advantages of the present invention may include the ability to replicate the surface finish of the underlying substrate and the ability to uniformly coat complex shaped substrates.

DETAILED DESCRIPTION

The present invention is directed to a process for coating a substrate with diamond by chemical vapor deposition utilizing a fluidized bed. The fluidized bed particles may be any suitable bed material capable of being fluidized, e.g., a material such as a metal, an organic or a ceramic. Suitable materials can include metals such as tungsten, molybdenum, tantalum, copper, aluminum, or silicon, ceramics such as silicon carbide, silicon nitride, aluminum oxide, aluminum nitride, boron nitride, boron carbide, beryllium oxide, zirconium oxide, tungsten carbide, tantalum carbide, or molybdenum carbide, and organics such as carbon, i.e., graphite or diamond, polyimides, polyetherketones, polyester-LCP's, diallylphthalates and glass modified versions of such organics. The term "metal" is also meant to include alloys of such metals. Selection of the materials for the fluidized bed particles as well as the size or dimensions and the density of such materials may help control the location within selected zones of the fluidized bed of the substrate or substrates to be coated. Control of the location may be beneficial by controlling the temperature of the fluidized bed zone.

The term diamond in the following context will have its normal meaning, i.e., a substantially transparent hard, strong allotrope of carbon consisting of $sp^3$-bonded carbon atoms which is thermodynamically stable at elevated pressures. As used herein, the term diamond is also intended to encompass $sp^3$-bonded carbon such as Lonsdaleite, as well as other polytypes and allotypes of carbon which have properties similar to those of $sp^3$-bonded carbon. Generally, the term "diamond" is meant to include materials sometimes described as diamond, synthetic diamond, or diamond-like.

In one embodiment, according to the present invention a fluidized bed is first prepared from particles in the form of, e.g., grains, fibers, or other suitable shapes. Generally, the particles may have extreme dimensions, i.e., the largest dimension in any particular direction, of from about 1 micron to about 2000 microns, preferably from about 10 microns to about 1000 microns in encompassing the substrate to be coated via diamond deposition. The fluidized bed can then be subjected to conditions, e.g., of diamond deposition generally known in the art as plasma enhanced chemical vapor deposition (PECVD). Low pressure growth of diamond will typically occur at pressures of from about 0.1 Torr to about 1000 Torr, and at temperatures ranging from about 300° C. to 1000° C. Typical conditions include a gas mixture pressure in the range of about 1 Torr to about 100 Torr and temperatures from about 600° C. to 900° C. Particularly preferred conditions include a gas mixture pressure of from about 10 Torr to about 50 Torr and temperatures of from 600° C. to 900° C. The most preferable conditions include a temperature of about 850° C. with a gas mixture pressure of about 25 Torr.

The gas mixture refers to the combination of particular carbon source and to the source of hydrogen or fluorine necessary to generate the desired excitation mechanisms. Consistent with prior art teachings regarding diamond deposition, a minor amount of oxygen, methanol, water, ozone, carbon dioxide, carbon monoxide, or an ether or a halogen may also be included within the gas mixture.

Typical carbon source gases for the gas mixture include elemental carbon, alkanes such as methane, ethane, propane, butane, pentane, hexane and the like, alkenes such as ethene, propene, butene, pentene, hexene and the like, alkynes such as acetylene, propyne, butyne, pentyne, hexyne and the like, alkadienes such as 1,3-butadiene, 1,3-pentadiene, 1,4-hexadiene and the like, alkatrienes, cycloalkanes such as cyclobutane, cyclopentane, cyclohexane and the like, arenes such as benzene, naphthalene and the like, cumulenes such as isopropyl-benzene and the like, terpenes such as para-mentha-1,3-diene and the like and oxy derivatives of such materials, i.e., alcohols, ethers, esters, ketones, acids and carbonyl derivatives. The carbon source gas may also be selected from among chlorinated or fluorinated hydrocarbons such as dichloromethane, chloroform, carbon tetrachloride, and carbontetrafluoride.

It is also essential to the operation of the present invention that there be a source of atomic hydrogen or atomic fluorine in the gas mixture, or another way of promoting the desired carbon bonding on the substrate surface in the fluidized bed. Atomic hydrogen may be provided by dissociating molecular hydrogen in the chemical vapor deposition stream. This may be accomplished by applying energy, e.g., thermal or non-thermal energy, to the fluidized bed to cause dissociation of molecular hydrogen into atomic hydrogen. The non-thermal energy may be provided by resistive, inductive, radiant or other sources of energy to produce the required dissociation of molecular hydrogen. Means of producing atomic hydrogen include, but are not limited to, electric discharges initiated and/or sustained by direct current, low frequency alternating current, radio frequency radiation, microwave radiation, or ultraviolet radiation. Atomic fluorine may be provided by dissociating molecular fluorine in the chemical vapor deposition stream.

Alternatively, atomic hydrogen may be provided by substantially non-thermal dissociation of molecular hydrogen upon a catalytic matrix. This may be accomplished, for example, by directing molecular hydrogen onto a catalytic surface, such as platinum. Many such catalytic materials may be utilized which are known from the art of hydrogenation, such as platinum, palladium, nickel, Raney nickel, lead, and other hydrogenation catalysts. The preferred catalytic matrix for dissociating molecular hydrogen to atomic hydrogen for the present invention is palladium. The flowing gas mixture may also comprise an appropriate inert gas such as helium or argon to modify ionization thresholds and/or deposition kinetics, as desired, and to optimize the deposition parameters.

The substrate to be coated by the chemical vapor deposition in the fluidized bed can be comprised of a different material than the fluidized bed particles or may be of the same material as the bed particles. Generally, the substrate will be of different dimensions than the fluidized bed particles. The substrate may generally be of materials such as metals, organics or ceramics, e.g., of a material such as a steel, stainless steel, tungsten, a carbide of boron, chromium, hafnium, molybdenum, niobium, silicon, tantalum, titanium, tungsten, vanadium or zirconium, a ceramic such as a boride of chromium, hafnium, molybdenum, niobium, tantalum, titanium, tungsten, vanadium or zirconium, a nitride of boron, chromium, hafnium, niobium, silicon, tantalum, titanium, vanadium or zirconium, an oxide of aluminum, beryllium, cerium, chromium, hafnium, magnesium, silicon, titanium, or zirconium, a silicide of chromium, molybdenum, niobium, tantalum, titanium, tungsten, or vanadium, or a fluoride of dysprosium, erbium, europium, holmium, neodymium, samarium, terbium, or ytterbium, or an organic such as a polyimide, a polyetherketone, a polyester-LCP, a diallylphthalate or a glass modified version of such an organic. The substrate may also be an optical substrate, e.g., an optical surface comprised of a material selected from the group consisting of silicon, sapphire, quartz, or group II–VI compounds selected from the group consisting of zinc-selenide, zinc-sulfide, zinc-telluride, cadmium-selenide, cadmium-sulfide, cadmium-telluride, mercuric-selenide, mercuric-sulfide, and ternary or quaternary mixtures thereof.

The bed of particles may be fluidized by the flow of gas mixture including the gaseous carbon source. Other components of the fluidizing gas may be molecular hydrogen which provides a source of atomic hydrogen as described above and a carrier gas, such as helium. Other methods of fluidizing the bed of particles may be utilized such as by mechanical means, e.g., by applying a vibrating force to the bed or by introducing the particulate substrate into an electric field oriented to levitate the particles by electrostatic force. Apparatus and methods for maintaining a fluidized bed by flowing gases, vibration, electrostatic levitation or combinations thereof are generally known to those in the catalytic fluidized bed art. By using low pressure chemical vapor deposition methods for depositing diamond coatings upon a substrate within a fluidized bed in accordance with the present invention, the resultant diamond coating can have reduced grain size diamond films, i.e., grain sizes substantially less than about 2 microns, such grain sizes being substantially uniform in size. Further, the resultant diamond coating can be essentially pin-hole free. This is believed to be an advantage over methods of coating substrates with synthetic diamond by chemical vapor deposition processes previously known in the art.

The diamond coating formed in the present process is generally from about 0.01 microns to about 1000 microns in thickness, although greater thicknesses may be achieved by continuation of the process for longer time periods. More preferably, the present process is used to form coatings of from about 1 micron to about 100 microns.

The deposition process according to the present invention may be conducted as a batch process whereby the deposition is continued until the desired coating thickness is produced, at which time the flow of the gas mixture including the carbon source gas is terminated and the product is cooled. Alternatively, the process may be conducted as a continuous process.

The present invention is more particularly described in the following example which is intended as illustrative only, since numerous modifications and variations will be apparent to those skilled in the art.

EXAMPLE 1

Tungsten carbide substrates of about 10 millimeter square and 1 millimeter thick dimensions are placed into a quartz fluidized bed reactor charged with silicon carbide spheres of about 0.25 millimeter diameter, the reactor permitting the flow of gas through the particulate mass, i.e., the silicon carbide spheres. The bed of spheres is fluidized by passing a gas mixture of about 99 percent by volume hydrogen and about 1 percent by volume methane through the reactor at a pressure of about 40 Torr. The fluidized bed of particles is heated to a nominal temperature of about 850° C. by subjecting the walls of the quartz reactor to thermal heating. The fluidizing gas mixture is then subjected to high frequency plasma generation at 2.45 Gigahertz (GHz) to trigger excitation mechanisms. Flow rates and pressures are adjusted to produce a diamond coating with a grain size of from about 0.1 to about 0.3 microns, a size substantially less than conventional grain sizes of about 2 microns and the grain sizes of the resultant coating are substantially uniform.

Although the present invention has been described with reference to specific details, it is not intended that such details should be regarded as limitations upon the scope of the invention, except as and to the extent that they are included in the accompanying claims.

What is claimed is:

1. A process for coating a substrate with diamond comprising:

maintaining a substrate within a bed of particles capable of being fluidized, said particles having substantially uniform dimensions and said substrate characterized as having different dimensions than the particles;

fluidizing the bed of Particles; and, depositing a coating of diamond upon the substrate by chemical vapor deposition of a carbon-containing precursor gas mixture, said precursor gas mixture introduced into the fluidized bed of particles in quantities, at pressures and at temperatures, under conditions resulting in excitation mechanisms sufficient to form said diamond coating, the substrate further characterized as comprised of a different material than the bed of particles.

2. A process for coating a substrate with diamond comprising:

maintaining a substrate within a bed of particles capable of being fluidized, said particles having substantially uniform dimensions and said substrate characterized as comprised of a different material than the particles;

fluidizing the bed of particles;

depositing a coating of diamond upon the substrate by chemical vapor deposition of a carbon-containing precursor gas mixture, said precursor gas mixture introduced into the fluidized bed of particles in quantities, at pressures and at temperatures, under conditions resulting in excitation mechanisms sufficient to form said diamond coating.

3. The process of claim 2 wherein the diamond coating is from about 0.01 microns to about 1000 microns in thickness.

4. The process of claim 2 wherein the substrate is comprised of a material selected from the groups consisting of metals, ceramics, and organics.

5. The process of claim 2 wherein the substrate is an optical surface comprised of a material selected from the group consisting of silicon, sapphire, quartz, or group II–VI compounds selected from the group consisting of zinc-selenide, zinc-sulfide, zinc-telluride, cadmium-selenide, cadmium-sulfide, cadmium-telluride, mercuric-selenide, mercuric sulfide and ternary or quaternary mixtures thereof.

6. The process of claim 2 wherein the bed particles are from about 1 micron to about 2 millimeters in extreme dimension.

* * * * *